(12) United States Patent
Fouquet et al.

(10) Patent No.: US 8,385,028 B2
(45) Date of Patent: Feb. 26, 2013

(54) GALVANIC ISOLATOR

(75) Inventors: Julie E. Fouquet, Portola Valley, CA (US); Gary R. Trott, San Mateo, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 181 days.

(21) Appl. No.: 12/731,999

(22) Filed: Mar. 25, 2010

(65) Prior Publication Data
US 2010/0176660 A1 Jul. 15, 2010

Related U.S. Application Data

(62) Division of application No. 11/512,034, filed on Aug. 28, 2006, now Pat. No. 7,791,900.

(51) Int. Cl.
*H01F 38/14* (2006.01)
*H05K 1/11* (2006.01)
*H05K 1/18* (2006.01)

(52) U.S. Cl. ............ 361/1; 336/200; 361/761; 361/762; 361/783

(58) Field of Classification Search .................. 336/200; 361/1, 761, 762, 783
See application file for complete search history.

(56) References Cited

U.S. PATENT DOCUMENTS

| | | | |
|---|---|---|---|
| 4,027,152 A | 5/1977 | Brown et al. | |
| 4,236,086 A * | 11/1980 | Hoebel | 307/149 |
| 4,494,100 A | 1/1985 | Stengel et al. | |
| 4,541,894 A | 9/1985 | Cassat | |
| 4,931,075 A | 6/1990 | Kuhn | |
| 5,015,972 A | 5/1991 | Cygan et al. | |
| 5,070,317 A | 12/1991 | Bhagat | |
| 5,312,674 A | 5/1994 | Haertling et al. | |
| 5,363,081 A | 11/1994 | Bando et al. | |
| 5,420,558 A | 5/1995 | Ito et al. | |
| 5,504,668 A | 4/1996 | Beyerlein | |
| 5,597,979 A | 1/1997 | Courtney et al. | |
| 5,659,462 A | 8/1997 | Chen et al. | |
| 5,693,971 A | 12/1997 | Gonzales | |
| 5,716,713 A | 2/1998 | Zsamboky et al. | |
| 5,754,088 A | 5/1998 | Fletcher et al. | |
| 5,768,111 A | 6/1998 | Zaitsu | |
| 5,825,259 A | 10/1998 | Harpham | |
| 5,952,849 A | 9/1999 | Haigh | |
| 6,167,475 A | 12/2000 | Carr | |

(Continued)

FOREIGN PATENT DOCUMENTS

| CN | 1180277 | 4/1998 |
|---|---|---|
| CN | 1237081 | 12/1999 |

(Continued)

OTHER PUBLICATIONS

Biersach et al., "Designing Medical Electrical Equipment to Meet Safety Certification and Regulatory Requirements", Underwriters Laboratories, 6 pages, Table 2, Jan. 2002.*

(Continued)

*Primary Examiner* — Evan Pert

(57) ABSTRACT

A galvanic isolator having a split circuit element, a polymeric substrate, a transmitter and receiver is disclosed. The split circuit element has first and second portions, the first portion being disposed on a first surface of the substrate and the second portion being disposed a second surface of the substrate. The transmitter receives an input signal and couples a signal derived from the input signal to the first portion. The receiver is connected to the second portion of the circuit element and generates an output signal that is coupled to an external circuit. The galvanic isolator can be economically fabricated on conventional printed circuit board substrates and flexible circuit substrates.

5 Claims, 10 Drawing Sheets

U.S. PATENT DOCUMENTS

| | | |
|---|---|---|
| 6,175,293 B1 | 1/2001 | Hasegawa et al. |
| 6,198,374 B1 | 3/2001 | Abel |
| 6,215,377 B1 | 4/2001 | Douriet et al. |
| 6,255,714 B1 | 7/2001 | Kossives et al. |
| 6,300,617 B1 | 10/2001 | Daughton |
| 6,307,457 B1 | 10/2001 | Wissink et al. |
| 6,320,532 B1 | 11/2001 | Diede |
| 6,404,317 B1 | 6/2002 | Mizoguchi et al. |
| 6,476,704 B2 | 11/2002 | Goff |
| 6,489,850 B2 | 12/2002 | Heineke et al. |
| 6,501,364 B1 | 12/2002 | Hui et al. |
| 6,525,566 B2 | 2/2003 | Haigh et al. |
| 6,538,313 B1 | 3/2003 | Smith |
| 6,545,059 B1 | 4/2003 | Fichou |
| 6,556,117 B1 | 4/2003 | Nakao et al. |
| 6,574,091 B2 | 6/2003 | Heineke et al. |
| 6,661,079 B1 | 12/2003 | Bikulcius et al. |
| 6,686,825 B2 | 2/2004 | Tamezawa et al. |
| 6,856,226 B2 | 2/2005 | Gardner |
| 6,859,130 B2 | 2/2005 | Nakashima et al. |
| 6,867,678 B2 | 3/2005 | Yang |
| 6,870,456 B2 | 3/2005 | Gardner |
| 6,873,065 B2 | 3/2005 | Haigh et al. |
| 6,888,438 B2 | 5/2005 | Hui et al. |
| 6,891,461 B2 | 5/2005 | Gardner |
| 6,903,578 B2 | 6/2005 | Haigh et al. |
| 6,919,775 B2 | 7/2005 | Wendt et al. |
| 6,922,080 B2 | 7/2005 | Haigh et al. |
| 6,943,658 B2 | 9/2005 | Gardner |
| 6,944,009 B2 | 9/2005 | Nguyen et al. |
| 7,016,490 B2 * | 3/2006 | Beutler et al. ............... 379/412 |
| 7,064,442 B1 | 6/2006 | Lane et al. |
| 7,170,807 B2 | 1/2007 | Fazan et al. |
| 7,171,739 B2 | 2/2007 | Yang et al. |
| 7,302,247 B2 | 11/2007 | Dupuis |
| 7,376,212 B2 | 5/2008 | Dupuis |
| 7,421,028 B2 | 9/2008 | Dupuis |
| 7,425,787 B2 | 9/2008 | Larson, III |
| 7,436,282 B2 | 10/2008 | Whittaker et al. |
| 7,447,492 B2 | 11/2008 | Dupuis |
| 7,460,604 B2 | 12/2008 | Dupuis |
| 7,545,059 B2 | 6/2009 | Chen |
| 7,577,223 B2 | 8/2009 | Alfano |
| 7,650,130 B2 | 1/2010 | Dupuis |
| 7,683,654 B2 | 3/2010 | Chen |
| 7,692,444 B2 | 4/2010 | Chen |
| 7,719,305 B2 | 5/2010 | Chen |
| 7,737,871 B2 | 6/2010 | Leung et al. |
| 7,738,568 B2 | 6/2010 | Alfano |
| 7,741,943 B2 | 6/2010 | Fouquet |
| 7,746,943 B2 | 6/2010 | Yamaura |
| 7,821,428 B2 | 10/2010 | Laung |
| 7,856,219 B2 | 12/2010 | Dupuis |
| 7,920,010 B2 | 4/2011 | Chen |
| 7,932,799 B2 | 4/2011 | Loef et al. |
| 7,948,067 B2 | 5/2011 | Dominique et al. |
| 8,049,573 B2 | 11/2011 | Alfano |
| 8,061,017 B2 | 11/2011 | Fouquet |
| 8,064,872 B2 | 11/2011 | Dupuis |
| 8,093,983 B2 | 1/2012 | Fouquet |
| 2002/0075116 A1 | 6/2002 | Peels et al. |
| 2002/0110013 A1 | 8/2002 | Park et al. |
| 2002/0135236 A1 | 9/2002 | Haigh et al. |
| 2003/0042571 A1 | 3/2003 | Chen et al. |
| 2004/0056749 A1 | 3/2004 | Kahlmann et al. |
| 2005/0003199 A1 | 1/2005 | Takaya et al. |
| 2005/0057277 A1 | 3/2005 | Chen et al. |
| 2005/0077993 A1 | 4/2005 | Kanno et al. |
| 2005/0094302 A1 | 5/2005 | Matsuzaki et al. |
| 2005/0128038 A1 | 6/2005 | Hyvonen |
| 2005/0133249 A1 | 6/2005 | Fujii |
| 2005/0269657 A1 | 12/2005 | Dupuis |
| 2005/0272378 A1 | 12/2005 | Dupuis |
| 2006/0028313 A1 | 2/2006 | Strzalkowski et al. |
| 2006/0095639 A1 | 5/2006 | Guenin et al. |
| 2006/0152322 A1 | 7/2006 | Whittaker et al. |
| 2006/0170527 A1 | 8/2006 | Braunisch |
| 2006/0176137 A1 | 8/2006 | Sato et al. |
| 2006/0214759 A1 | 9/2006 | Kawarai |
| 2006/0220775 A1 | 10/2006 | Ishikawa |
| 2007/0080587 A1 * | 4/2007 | Ruizenaar et al. .............. 307/89 |
| 2007/0085447 A1 | 4/2007 | Larson, III |
| 2007/0085632 A1 | 4/2007 | Larson, III et al. |
| 2007/0086274 A1 | 4/2007 | Nishimura et al. |
| 2007/0133923 A1 | 6/2007 | Han |
| 2007/0281394 A1 | 12/2007 | Kawabe et al. |
| 2007/0290784 A1 | 12/2007 | Nesse et al. |
| 2008/0007382 A1 | 1/2008 | Snyder |
| 2008/0031286 A1 | 2/2008 | Alfano et al. |
| 2008/0051158 A1 | 2/2008 | Male et al. |
| 2008/0061631 A1 | 3/2008 | Fouquet et al. |
| 2008/0174396 A1 | 7/2008 | Choi et al. |
| 2008/0176362 A1 | 7/2008 | Sengupta et al. |
| 2008/0179963 A1 | 7/2008 | Fouquet et al. |
| 2008/0180206 A1 | 7/2008 | Fouquet |
| 2008/0198904 A1 | 8/2008 | Chang |
| 2008/0278275 A1 | 11/2008 | Fouquet et al. |
| 2008/0284552 A1 | 11/2008 | Lim et al. |
| 2008/0308817 A1 | 12/2008 | Wang et al. |
| 2008/0311862 A1 | 12/2008 | Spina et al. |
| 2009/0072819 A1 | 3/2009 | Takahashi |
| 2009/0243782 A1 | 10/2009 | Fouquet et al. |
| 2009/0243783 A1 | 10/2009 | Fouquet et al. |
| 2009/0268486 A1 | 10/2009 | Ljusev et al. |
| 2010/0020448 A1 | 1/2010 | Ng et al. |
| 2010/0052120 A1 | 3/2010 | Pruitt |
| 2010/0176660 A1 | 7/2010 | Fouquet |
| 2010/0188182 A1 | 7/2010 | Fouquet et al. |
| 2010/0259909 A1 | 10/2010 | Ho et al. |
| 2010/0328902 A1 | 12/2010 | Ho et al. |
| 2011/0075449 A1 | 3/2011 | Fouquet |
| 2011/0095620 A1 | 4/2011 | Fouquet |

FOREIGN PATENT DOCUMENTS

| | | |
|---|---|---|
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 8-241955 | 9/1996 |
| JP | 2000-508116 | 6/2000 |
| JP | 2003-151829 | 5/2003 |
| JP | 2005-513824 | 5/2005 |
| JP | 2008-61236 | 3/2008 |
| WO | WO-9734349 | 3/1997 |
| WO | WO-2005/001928 | 6/2005 |
| WO | WO-20060033071 | 3/2006 |

OTHER PUBLICATIONS

Doane et al., "Multichip Module Technologies and Alternatives—The Basics", Section 5.3.2, p. 185, 1993.*

U.S. Appl. No. 11/264,956, filed Nov. 1, 2005, Guenin et al.

U.S. Appl. No. 11/512,034, filed Aug. 28, 2006, Fouquet et al.

U.S. Appl. No. 11/747,092, filed May 10, 2007, Fouquet et al.

"Texas Instruments Dual Digital Isolators", SLLS755E Jul. 2007.

Allflex Flexible Printed Circuit, "Design Guide", <http://www.allflexinc.com> Retrieved Feb. 12, 2009.

Analog Devices, "iCoupler R Digital Isolation Products", 2005.

Analog Devices, Inc., "iCoupler Digital Isolator ADuM1100 Data Sheet,",*Rev F* 2006.

Avago Technologies, "ACCL-9xxx 3.3V/5V High Speed CMOS Capacitive Isolator", *Preliminary Datasheet*. 2005.

Chen, Baoxing et al., "High Speed Digital Isolators Using Microscale On-Chip Transformers", Jul. 22, 2003.

Chen, Baoxing, "iCoupler Products with iso Power Technology", "*Signal and Power Transfer Across Isolation Barrier Using Microtransformers*" Analog Devices 2006.

Electronic Design, "Planar Transformers make Maximum Use of Precious Board Space", *Penton Media, Inc.*, ED Online ID #7647 Mar. 9, 1998.

Kliger, R., "Integrated Transformer-Coupled Isolation", Mar. 2003.

Krupka, J. et al., "Measurements of Permittivity, Loss Dielectric Tangent, and Resistivity of Float-Zone Silicon at Microwave Frequencies", *IEEE Abstract Microwave Theory and Techniques*, IEEE Transaction on vol. 54, Issue 11 Nov. 2006, 3995-4001.

Myers, John et al., "GMR Isolators", *Nonvalatile Electronics, Inc.* 1998.

Oljaca, Miroslav, "Interfacing the ADS1202 Modulator with a Pulse Transformer in Galvanically Isolated Systems", SBAA096 Jun. 2003, 22 pages.

Payton Group International, "Off the Shelf SMT Planar Transformers", <http://www.paytongroup.com> Retrieved Mar. 31, 2008.

Rogers Corporation, "Advanced Circuit Materials, High Frequency Laminates and Flexible Circuit Materials", <http://www.rogerscorporation.com/mwu/translations/prod.htm> Mar. 2008.

Smith, Carl H. et al., "Chip-Size Magnetic Sensor Arrays", May 21, 2002.

Yang, Ru-Yuan, "Loss Characteristics of Silicon Substrate with Different Resistivities", *Microwave and Optical Technology Letters*, vol. 48, No. 9.

* cited by examiner

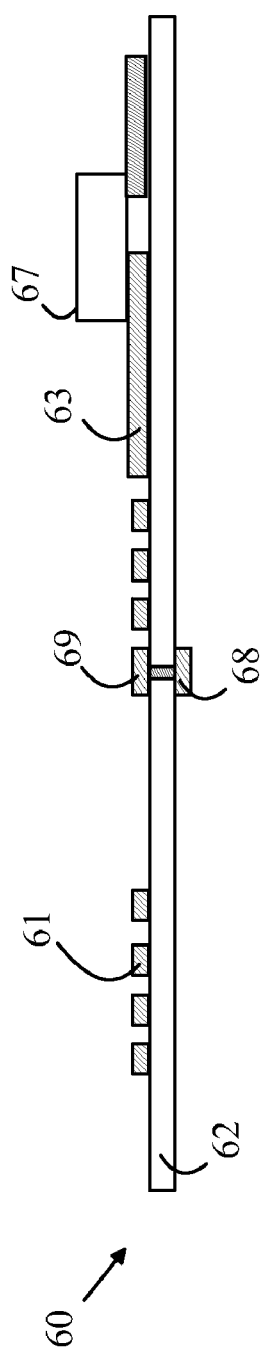
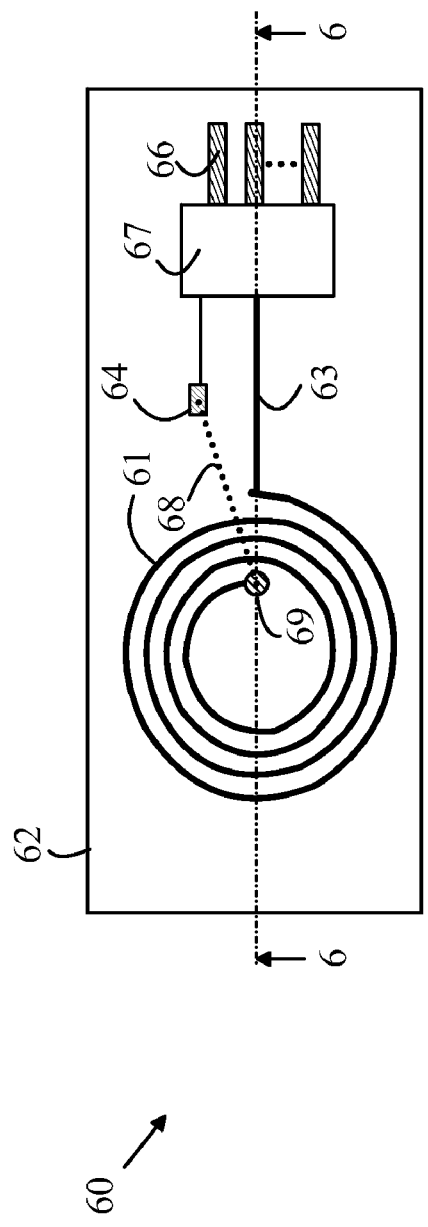
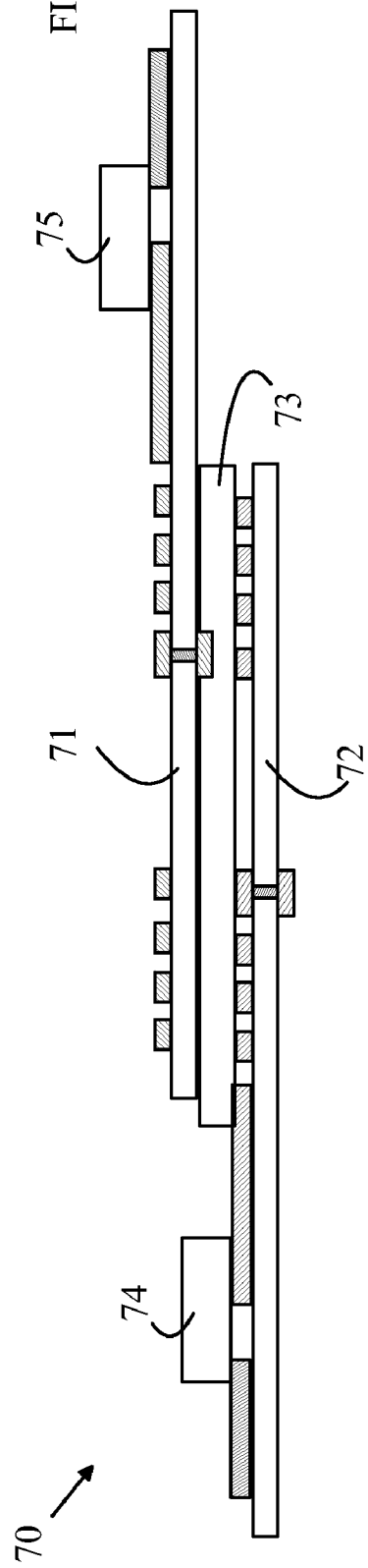
FIGURE 6
FIGURE 5
FIGURE 7

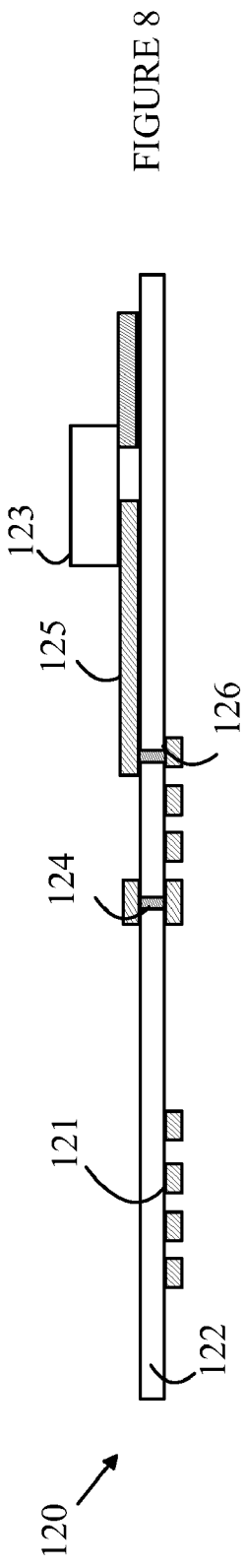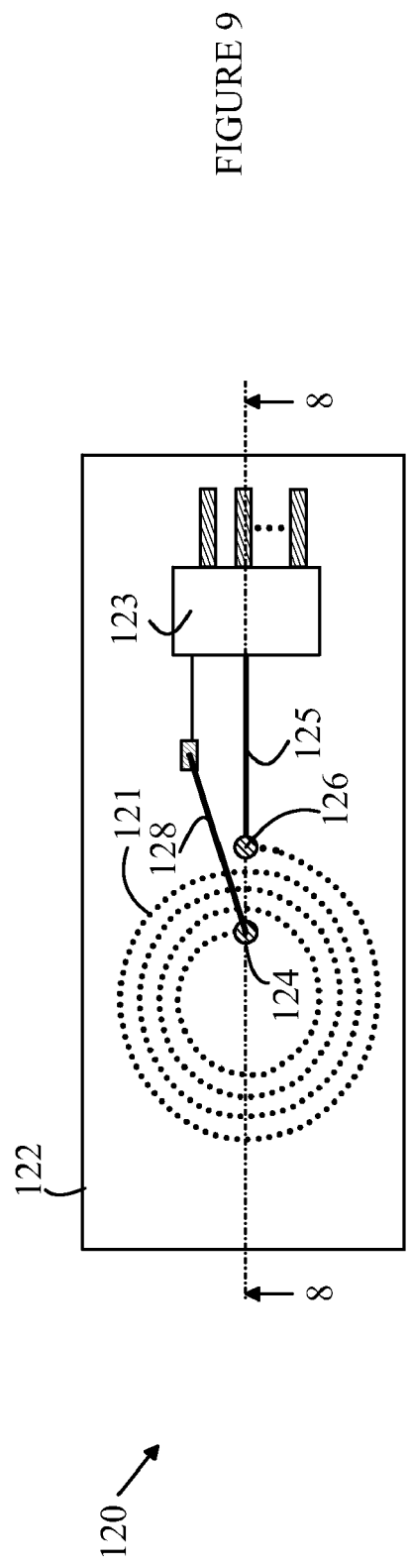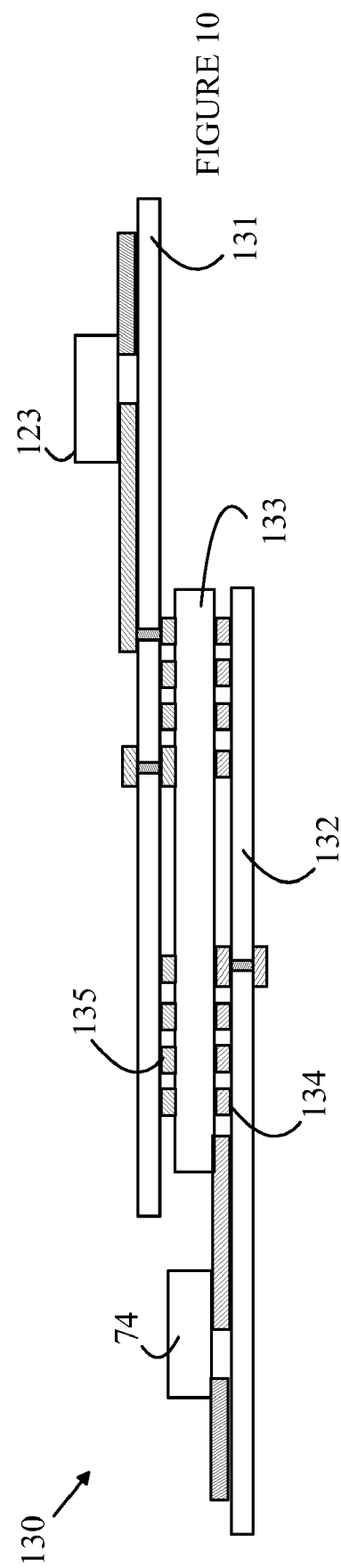

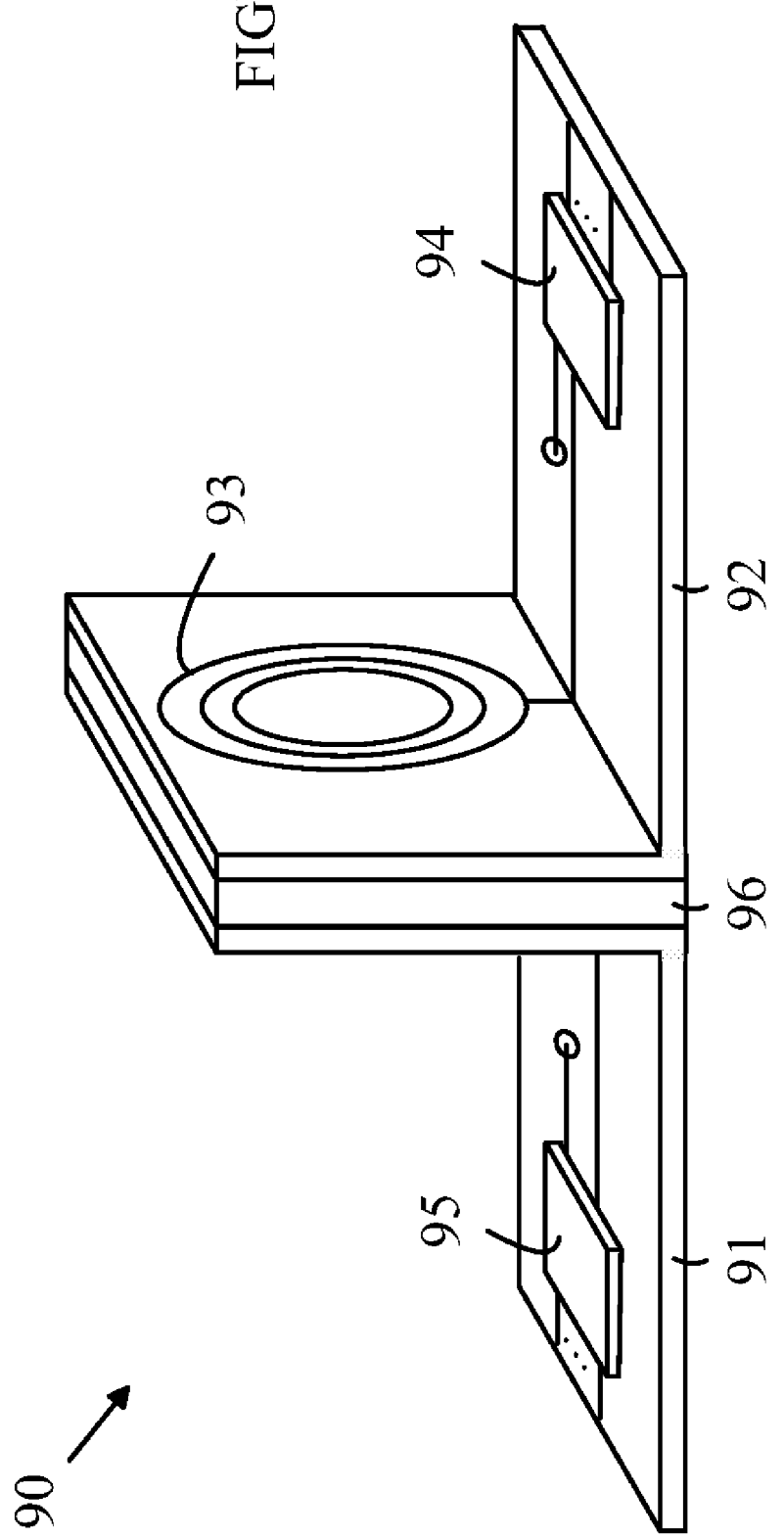

GALVANIC ISOLATOR

CROSS-REFERENCE TO RELATED APPLICATIONS

This is a divisional application of co-pending application Ser. No. 11/512,034, filed on Aug. 28, 2006, the entire disclosure of which is incorporated herein by reference.

BACKGROUND OF THE INVENTION

In many circuit arrangements, a logic signal must be transmitted between two circuits that must otherwise be electrically isolated from one another. For example, the transmitting circuit could utilize high internal voltages that would present a hazard to the receiving circuit or individuals in contact with that circuit. In the more general case, the isolating circuit must provide both voltage and noise isolation across an insulating barrier. Such isolation circuits are often referred to as "galvanic isolators". One class of galvanic isolators is based on transforming the logic signal to a light signal that is then transmitted to an optical receiver in the receiving circuit that converts the optical signal back to an electrical signal. The transmitting and receiving circuits are typically on separate substrates and connected to separate power supplies. While a significant number of commercial galvanic isolators are based on such optical transmission, optical galvanic isolators have a number of problems. For example, these circuits are electrically inefficient. Only a fraction of the signal power can be converted to an optical signal using a light emitting diode or similar device. At the receiver, the fraction of the power in the light signal that is recovered by the photodetector is very small. Hence, optical galvanic isolators require high power and signal amplification. In addition, the level of isolation provided by the circuits is limited by RF fields generated in the transmitting circuit and in the ambient environment, which are received by the circuitry in the receiving circuit and which are not related to the signals that are being sent optically. In principle, a conductive barrier can be utilized to shield the receiving circuit; however, such barriers block a portion of the light in the optical signal, and hence, further reduce the electrical efficiency of the isolator.

To overcome these limitations and others, a class of galvanic isolators based on one or more electrical transducers have been developed. One example is a transformer. In these galvanic isolators, the transmitter drives the primary winding of a transformer and the receiver is connected across the secondary winding. Typically, the transmitter and the two windings are constructed on a first semiconductor chip and the receiver is constructed on a separate chip that is connected to the first chip by wire bonds or the like. The two transformer windings are, typically, deposited over the drive circuits on the first chip by patterning two of the metal layers that are typically provided in conventional semiconductor fabrication processes.

The size of the transmitter chip is set by the size of the transformer coils, which typically require a significant area of silicon compared to the drive circuitry. The cost of the semiconductor substrate is a significant fraction of the cost of the isolator. This is a particularly significant problem in devices designed to operate at relatively low frequencies where large coils are required to provide the coupling between the transmitter and receiver. In addition, many applications require multiple independent galvanic isolators on a single substrate. Cross-talk between the isolators constructed on silicon substrates using conventional semiconductor fabrication techniques is difficult to block in a cost-effective manner because of fringe fields generated by one coil being coupled to an adjacent coil. If the chips are separated by a sufficient distance on the silicon substrate, the cost of the wasted silicon becomes significant.

In addition to the wasted silicon area, devices constructed using conventional silicon integrated circuit fabrication have limitations that are imposed by the design rules of the fabrication line and the limitations as to materials that are allowed on that line. For many applications, the dielectric insulation between the coils of the transformer must withstand voltages in excess of 1000 volts. The thickness of dielectric that is available in conventional CMOS fabrication lines is insufficient to provide this degree of insulation. In addition, in some applications, it would be advantageous to provide a ferrite layer between the coils of the transformer to improve the coupling efficiency. However, the materials in question cannot be utilized in many conventional fabrication lines.

SUMMARY OF THE INVENTION

The present invention includes a galvanic isolator having a split circuit element, a substrate, a transmitter and a receiver. The split circuit element has first and second portions. The substrate includes an insulating polymeric or polymeric/inorganic layer having first and second surfaces, the first and second portions are disposed on the substrate. The first portion of the circuit element can be disposed on the first surface, and the second portion can be disposed on the second surface. Alternatively, both portions can be disposed on the first surface. The choice of configuration depends on the specific split circuit element being implemented. The transmitter receives an input signal and couples a signal derived from the input signal to the first portion. The receiver is connected to the second portion of the circuit element and generates an output signal that is coupled to an external circuit. In one aspect of the invention, the split circuit element includes a transformer having a primary coil that includes the first portion and a secondary coil that includes the second portion. In another aspect of the invention, the split circuit element includes a capacitor having a first plate that includes the first portion and a second plate that includes the second portion. In yet another aspect of the invention, the split circuit element includes a transmitting antenna and a receiving antenna; the transmitting antenna includes the first portion, and the receiving antenna includes the second portion. In another aspect of the invention, the substrate is flexible.

BRIEF DESCRIPTION OF THE DRAWINGS

FIGS. 5 and 6 illustrate a component coil that can be utilized to construct a galvanic isolator according to another embodiment of the present invention.

FIG. 7 illustrates a galvanic isolator according to another embodiment of the present invention.

FIGS. 8-9 illustrate another embodiment of a component coil that can be utilized to construct a galvanic isolator according to another embodiment of the present invention.

FIG. 10 illustrates a galvanic isolator according to another embodiment of the present invention.

FIG. 11 illustrates another embodiment of a galvanic isolator according to the present invention.

DETAILED DESCRIPTION OF THE PREFERRED EMBODIMENTS OF THE INVENTION

Figure 2:
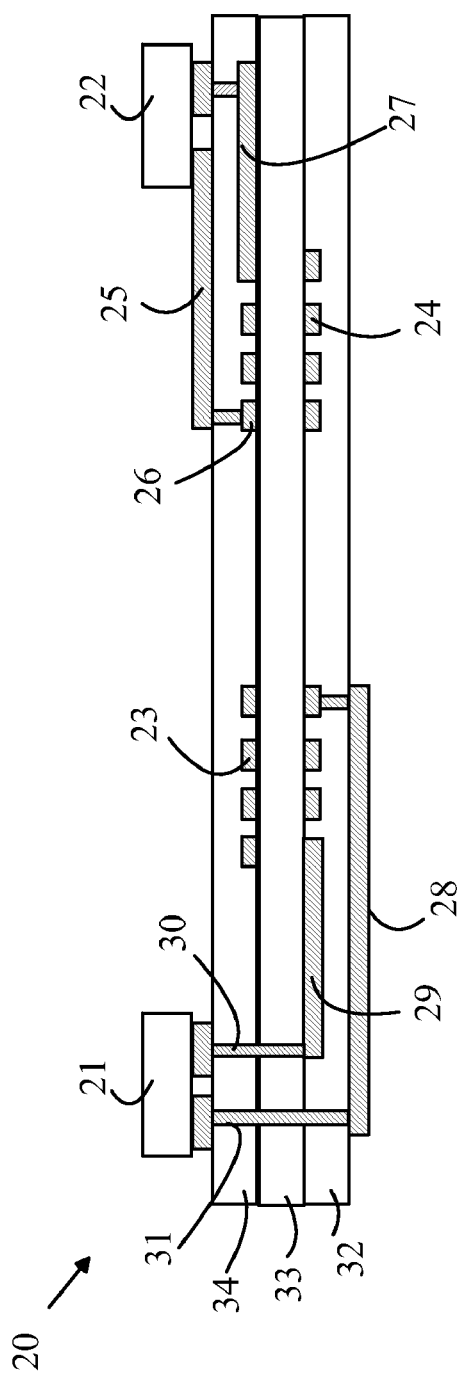
FIGS. 1 and 2 illustrate one embodiment of a galvanic isolator according to the present invention.
Figure 1:
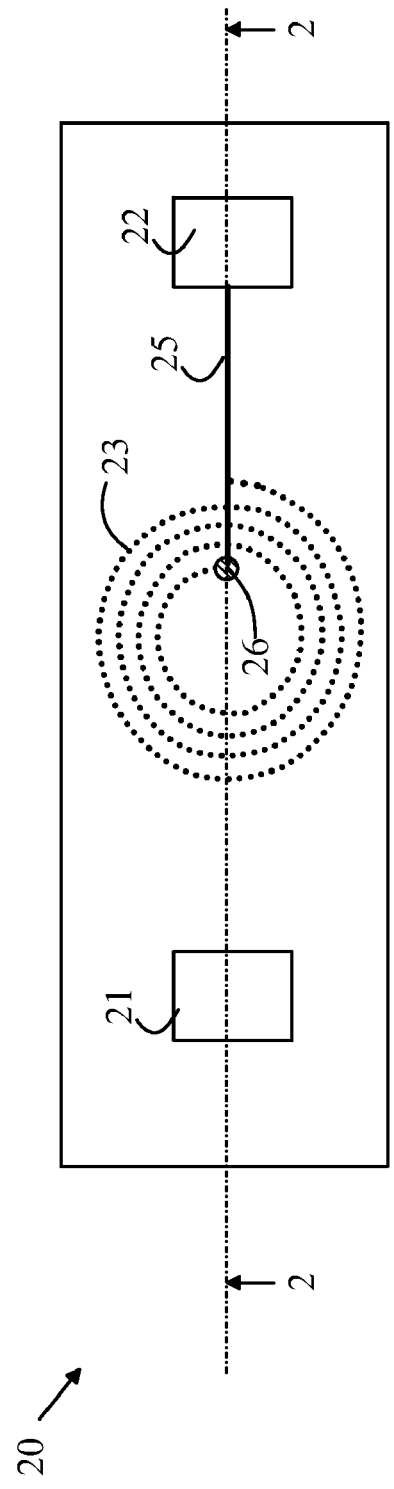

The manner in which the present invention provides its advantages can be more easily understood with reference to FIGS. 1 and 2, which illustrate one embodiment of a galvanic isolator according to the present invention. FIG. 1 is a top view of galvanic isolator 20, and FIG. 2 is a cross-sectional view of galvanic isolator 20 through line 2-2. Galvanic isolator 20 is includes a transmitter chip 21 and a receiver chip 22 that are bonded to a substrate in which coils 23 and 24 have been fabricated and connected to bond pads on the top surface of layer 34. Alternatively, transmitter chip 21 and receiver chip 22 may be attached to a lead frame and connected by wire bonds to bond pads attached to coils 23 and 24. Other packaging embodiments are possible as well. Coils 23 and 24 form a transformer. The transformer coils are fabricated by lithographically patterning metal layers on the surface of a polymeric substrate 33 that has sufficient thickness and insulation characteristics to withstand the voltages for which galvanic isolator 20 is designed.

Each coil has an outer end and an inner end. Each of these ends must be connected to the appropriate terminals on the transmitter or receiver chip associated with that coil. For each coil, one connection is made by a trace that is formed with the coil when the metal layer from which the coil is patterned is etched and one connection is made by a patterned metal layer on the outer surface of the substrate. For example, the connection to the inner end 26 of coil 23 is made via trace 25 on the outer surface of insulating layer 34. The connection to the outer end of coil 23 is made via trace 27 that is patterned from the same layer as coil 23. Trace 27 is connected to chip 22 by a vertical via through layer 34. Similarly, chip 21 is connected to the outer end of coil 24 by a trace 29 and vertical via 30, trace 29 being patterned from the same metal layer as coil 24. The inner end of coil 24 is connected to chip 21 by a trace 28 on the bottom surface of insulating layer 32 through a conducting via 31. Insulating layers may be added outside of the layers of metal including traces 25 and 28 to prevent electrical contact between traces 25 or 28 and outside conductors.

The structure shown in FIGS. 1 and 2 can be fabricated on a conventional printed circuit board fabrication line. Hence, the cost of galvanic isolator 20 is much less than that of a galvanic isolator constructed from silicon on a semiconductor fabrication line.

Figure 4:
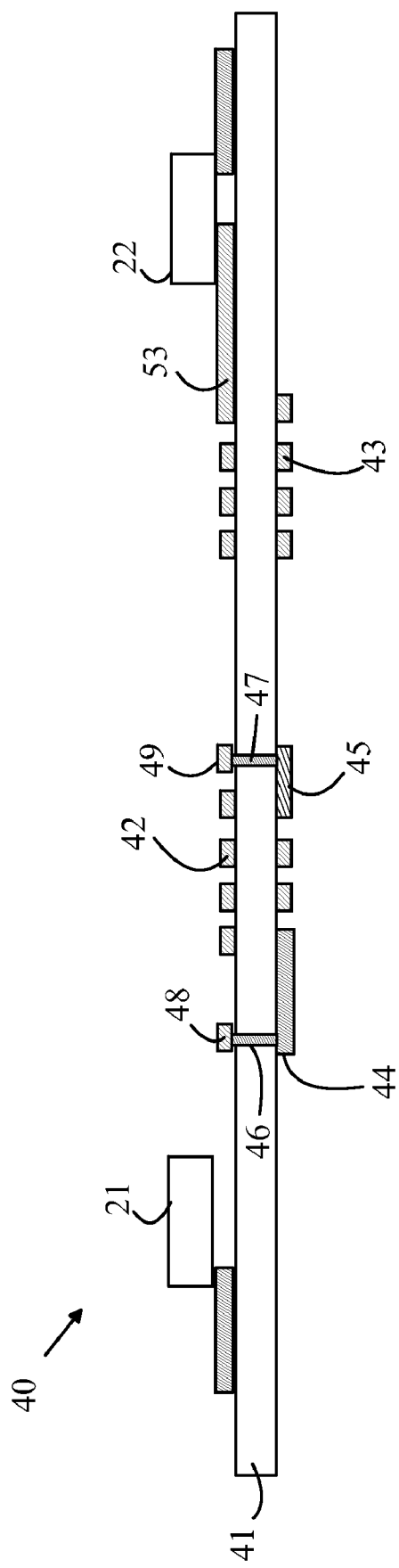
FIGS. 3 and 4 illustrate another embodiment of a galvanic isolator according to the present invention.
Figure 3:
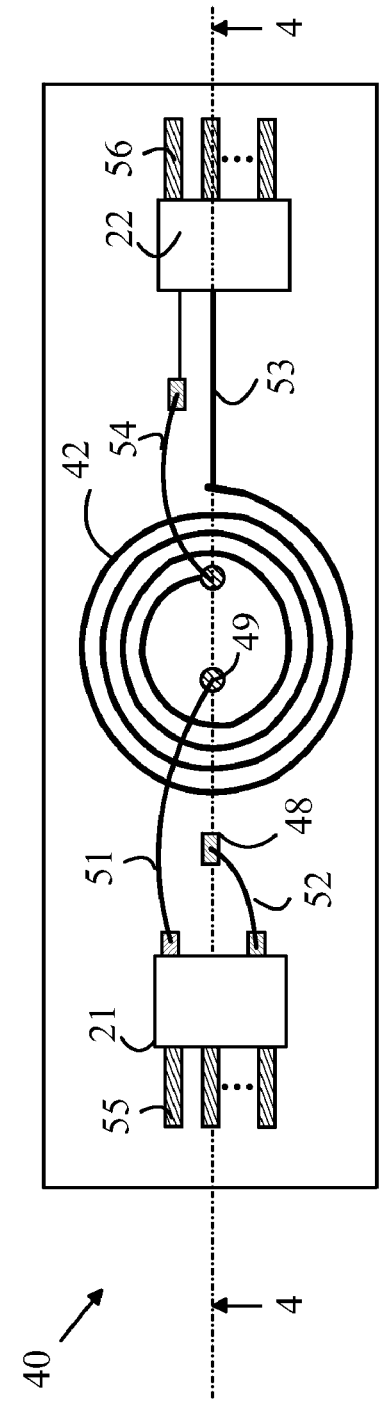

If wire bonding can be utilized, the structure shown in FIGS. 1 and 2 can be simplified to two metal layers on a single substrate. Refer now to FIGS. 3 and 4, which illustrate another embodiment of a galvanic isolator according to the present invention. FIG. 3 is a top view of galvanic isolator 40, and FIG. 4 is a cross-sectional view of galvanic isolator 40 through line 4-4 shown in FIG. 3. Galvanic isolator 40 is constructed from two metal layers that are deposited and patterned on a polymeric substrate 41 that has sufficient thickness to withstand the voltage differences between the two circuits being isolated. The top metal layer is patterned to provide coil 42 and the various connection pads utilized by transmitter 21 and receiver 22. The bottom layer is used to fabricate coil 43, which underlies coil 42 and forms the second coil of the transformer. The bottom layer is also patterned to provide the traces 44 and 45 that are used to connect coil 43 to wire bond pads 48 and 49 on the top surface of layer 41 through vertical conducting vias 46 and 47. Coil 43 is connected to transmitter 21 by wire bonds 51 and 52.

Coil 42 is connected to receiver 22 by trace 53 that is patterned from the top metal layer and by wire bond 54. Finally, the various connection pads for connecting galvanic isolator 40 to the external circuits that are to be isolated by galvanic isolator 40 are also patterned from the top metal layer. Exemplary connections pads of this type are shown at 55 and 56.

As noted above, a galvanic isolator according to the present invention can be constructed using conventional printed circuit board fabrication techniques. As will be explained in more detail below, embodiments based on flexible organic/inorganic or organic substrates are particularly attractive. Printed circuit boards or circuit carriers are known to the art, and hence, will not be discussed in detail here. For the purposes of the present discussion it is sufficient to note that printed circuit boards can be fabricated by depositing thin metal layers, or attaching metal layers, on a somewhat flexible organic/inorganic substrate formed of fiberglass impregnated with epoxy resin and then converting the layers into a plurality of individual conductors by conventional photolithographic techniques. Flex circuit technology is also a useful means of embodiment. Here substrates are made of an organic material such as polyimide. Films and laminates of this type are available commercially from Dupont and utilize substrates called Kapton™ made from polyimide and, in some cases, a plurality of layers are laminated with an adhesive. This type of circuit carrier or printed circuit board is significantly less expensive than silicon substrate-based circuitry and can be provided with relatively thin substrates. Thinner substrates are preferred in applications in which signal losses between the primary and secondary coils must be minimized. In one embodiment, a Pyralux AP laminate from Dupont that has a 2 mils thick Kapton™ layer and copper layers on the top and bottom surfaces is utilized.

The above-described embodiments utilize a substrate on which both coils of the transformer are fabricated by patterning and connecting various metal layers. However, in some situations, constructing a galvanic isolator from two separate transformer components provides significant advantages. Refer now to FIGS. 5 and 6, which illustrate a component coil that can be utilized to construct a galvanic isolator according to another embodiment of the present invention. FIG. 5 is a top view of component coil 60, and FIG. 6 is a cross-sectional view of component coil 60 through line 6-6. Component coil 60 is constructed from an insulating substrate 62 having top and bottom metal layers. The top layer is patterned to provide a coil 61 and a set of mounting pads for mounting a chip 67. The top layer also includes traces for connecting coil 61 to chip 67. The outer end of coil 61 is connected by a trace 63 to chip 67, and the inner end of coil 61 is connected by a trace from via 64. The top layer is also patterned to provide traces such as trace 66 for connecting chip 67 to external circuitry. The bottom metal layer is patterned to provide a conductor 68 that connects the inner end of coil 61 to via 64 by a second via 69.

Refer now to FIG. 7, which illustrates a galvanic isolator according to another embodiment of the present invention. Galvanic isolator 70 is constructed from two component coils 71 and 72 of the type discussed above with respect to FIGS. 5 and 6. Chip 75 on component coil 71 is a receiver, and chip 74 on component coil 72 is the corresponding transmitter. The two component coils are bonded to an insulator 73.

In FIG. 7 the standoff voltage that the galvanic isolator can withstand is set by the thickness and composition of layer 73. Hence, galvanic isolators having different design standoff voltages can be constructed from the same component coils, which, in turn, reduces costs associated with maintaining inventories of components and increases the economies of scale.

It should also be noted that layer 73 could include other materials that enhance the coupling efficiency of the two coils. For example, in embodiments in which high frequencies do not have to be accommodated, layer 73 could include a ferrite material that increases the coil coupling efficiency.

The embodiment shown in FIG. 7 has the disadvantage of having a larger distance between the two coils, since the coils are now separated by the thickness of the insulating layer 73 and the thickness of substrate 62. Since the power coupling efficiency of the transformer decreases with increasing distance between the coils, this loss in efficiency may be offset by the improvements in the economies of scale achieved by having a device constructed from two identical component coils.

Refer now to FIGS. 8-9, which illustrate another embodiment of a component coil that can be utilized to construct a galvanic isolator according to another embodiment of the present invention. FIG. 9 is a top view of component coil 120, and FIG. 8 is a cross-sectional view of component coil 120 through line 8-8. Component coil 120 differs from component coil 60 in that coil 121 is on the bottom surface of substrate 122 and is connected to the appropriate driver chip 123 by traces 125 and 128 that are on the top surface of substrate 121. These traces are connected to the ends of coil 121 by vertical vias 124 and 126.

Refer now to FIG. 10, which illustrates a galvanic isolator according to another embodiment of the present invention. Galvanic isolator 130 is constructed from two component coils on substrates 131 and 132. Component coil 135 on substrate 131 is of the type shown in FIGS. 8-9, and component coil 134 on substrate 132 is of the type shown in FIGS. 5-6. The two component coils are bonded to an insulator 133. Since the coils are not separated from the insulator by a layer of substrate, this embodiment allows the coils to be closer together for any given thickness of insulator 133.

Embodiments in which substrate 122 and the metal layers are part of a flexible circuit carrier have still further advantages. In some cases, the area available for mounting the galvanic isolator is limited. That is, the galvanic isolator must have a relatively small "footprint". In some of these cases, the area needed to implement the coils is larger than the footprint in question. Hence, to provide a galvanic isolator with the desired footprint, the coils must be implemented in a vertical arrangement to reduce that amount of horizontal surface area needed to mount the isolator. A component coil design such as that described above in which the component coils are constructed on a flexible circuit carrier provides a cost effective solution to this problem.

Refer now to FIG. 11, which illustrates another embodiment of a galvanic isolator according to the present invention. Galvanic isolator 90 is constructed from two component coil assemblies 91 and 92 that are similar to component coil 120 discussed above, except that the substrates are flexible. Each component coil includes coil 93 and a chip interface for mounting either a transmitter 94 or a receiver 95. The component coil assemblies are bent at 90 degrees and bonded to an insulating layer 96. Hence, the transformer is implemented out of the attachment plane and requires substantially less area.

Figure 13:
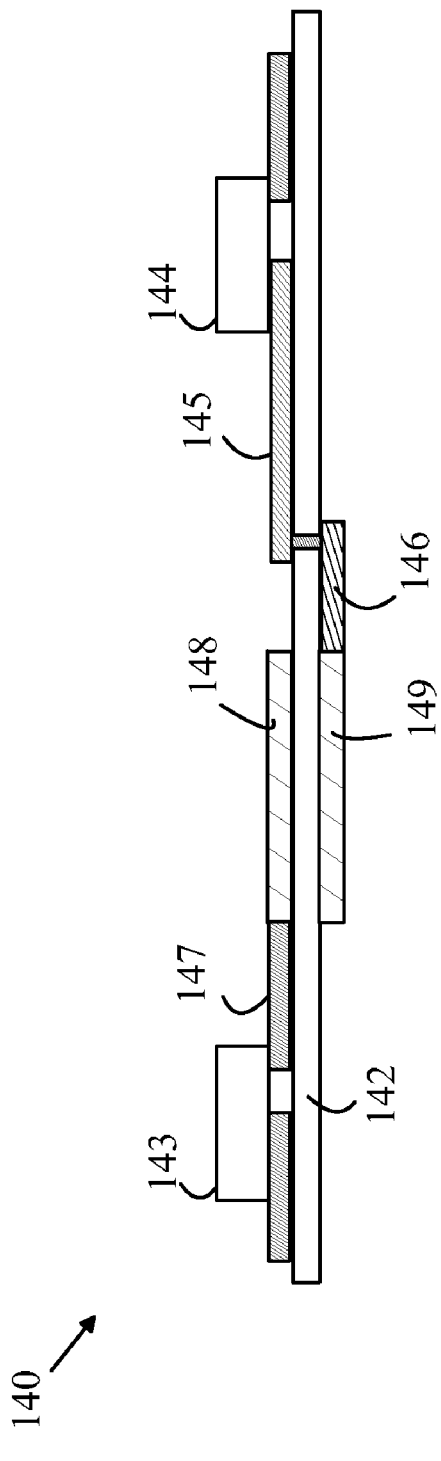
FIGS. 12-13 illustrate another embodiment of a galvanic isolator according to the present invention.
Figure 12:
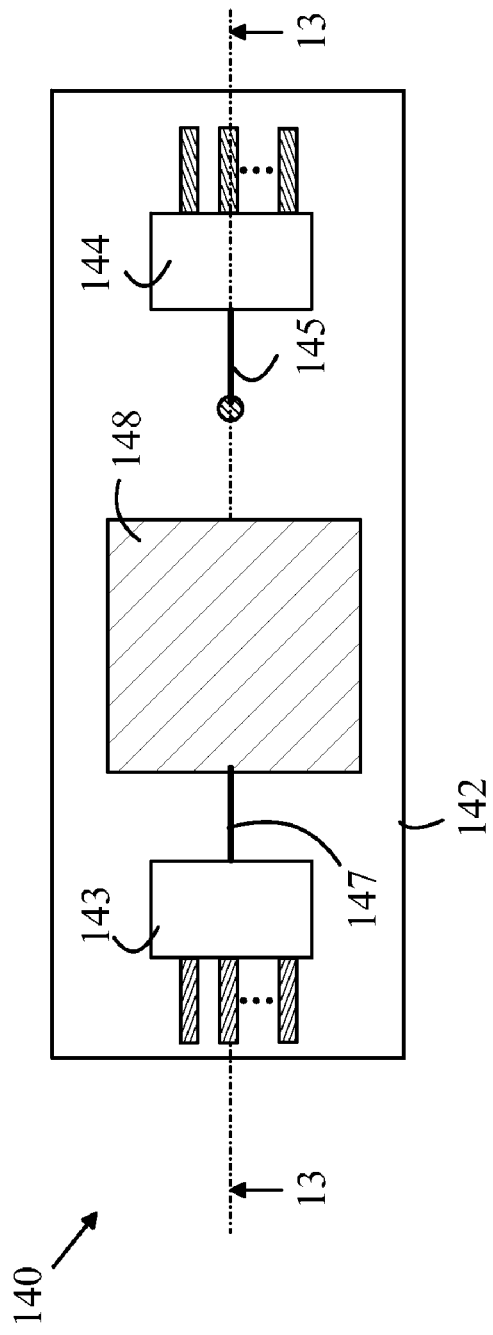

The above-described embodiments of the present invention utilize a split transformer arrangement to perform the isolation of the two circuits. However, embodiments that utilize other types of split circuit elements can also be constructed. For example, isolators based on capacitors in which the transmitting circuit drives one plate of a capacitor and the receiver is attached to the other plate of the capacitor can also be constructed. Refer now to FIGS. 12-13, which illustrate another embodiment of a galvanic isolator according to the present invention. FIG. 12 is a top view of galvanic isolator 140, and FIG. 13 is a cross-sectional view of galvanic isolator 140 through line 13-13 shown in FIG. 12. Galvanic isolator 140 utilizes a split capacitor arrangement to isolate transmitter 143 from receiver 144. The capacitor has plates 148 and 149. It should be noted that galvanic isolator 140 could be constructed from a single polymeric layer 142 that has metal layers deposited on the top and bottom surfaces thereof. Since only one connection is required at the edge of each plate of the capacitor, the problems associated with routing the additional connection discussed above with respect to the embodiments based on a split transformer are avoided. The connection to the bottom plate is provided by a trace 146 that is connected to a trace 145 on the top surface of substrate 142 by a single vertical via. The connection to the top plate is provided by trace 147.

It should also be noted that embodiments in which the transmitter and receiver plates are on separate substrates could also be constructed. Such embodiments are similar to those described above with the coils being replaced by the plates of the capacitor. Such two-substrate embodiments are useful in constructing embodiments that are analogous to that discussed above with reference to FIG. 7 and FIG. 11.

Embodiments based on a split antenna arrangement could also be constructed. In such embodiments, the capacitor plates described above with reference to FIGS. 12 and 13 are replaced by antennae that are fabricated by patterning the top and bottom layers metal layers. More complex antenna designs depending upon multiple vias between the top and bottom metal layer for each arm of the antenna may be fabricated as well.

Figure 14:
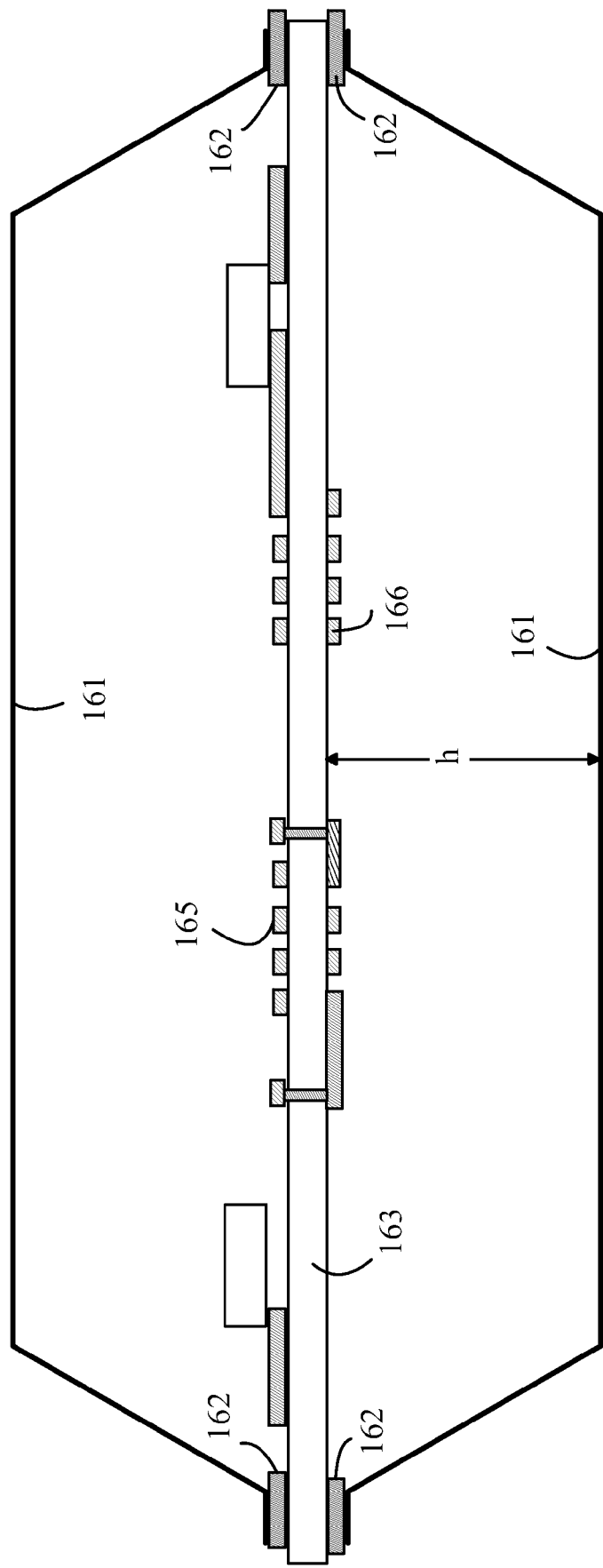
FIG. 14 is a cross-sectional view of a galvanic isolator according to another embodiment of the present invention that utilizes a shield.

In some cases, the galvanic isolators described above must function in environments having a significant amount of electrical interference. Since the split circuit elements used to construct the isolator can act as antennae that pickup this interference, embodiments that include shielding are required to prevent the received interference from altering the data signals being sent between the transmitter and receiver chips. Refer now to FIG. 14, which illustrates another embodiment of the present invention in which a shield is utilized. FIG. 14 is a cross-sectional view of a galvanic isolator such as that shown in FIG. 4, above. A conducting shield 161 is attached to substrate 163 by pads 162 that are patterned in the top and bottom metal layers. It should be noted that the shield cannot be too close to coils 165 and 166. If the distance from the coils to the shield, h, is less than a critical distance that depends on the frequencies of the signals being sent through the isolator, the shield will interfere with the operation of the isolator. In one exemplary embodiment having metal coil traces 1 mil high and 5 mil wide a shield height, h, of 100 mil is more than sufficient to avoid interference with isolator operation while a shield height, h, of 10 mil is too low and thus interferes with device operation.

Figure 15:
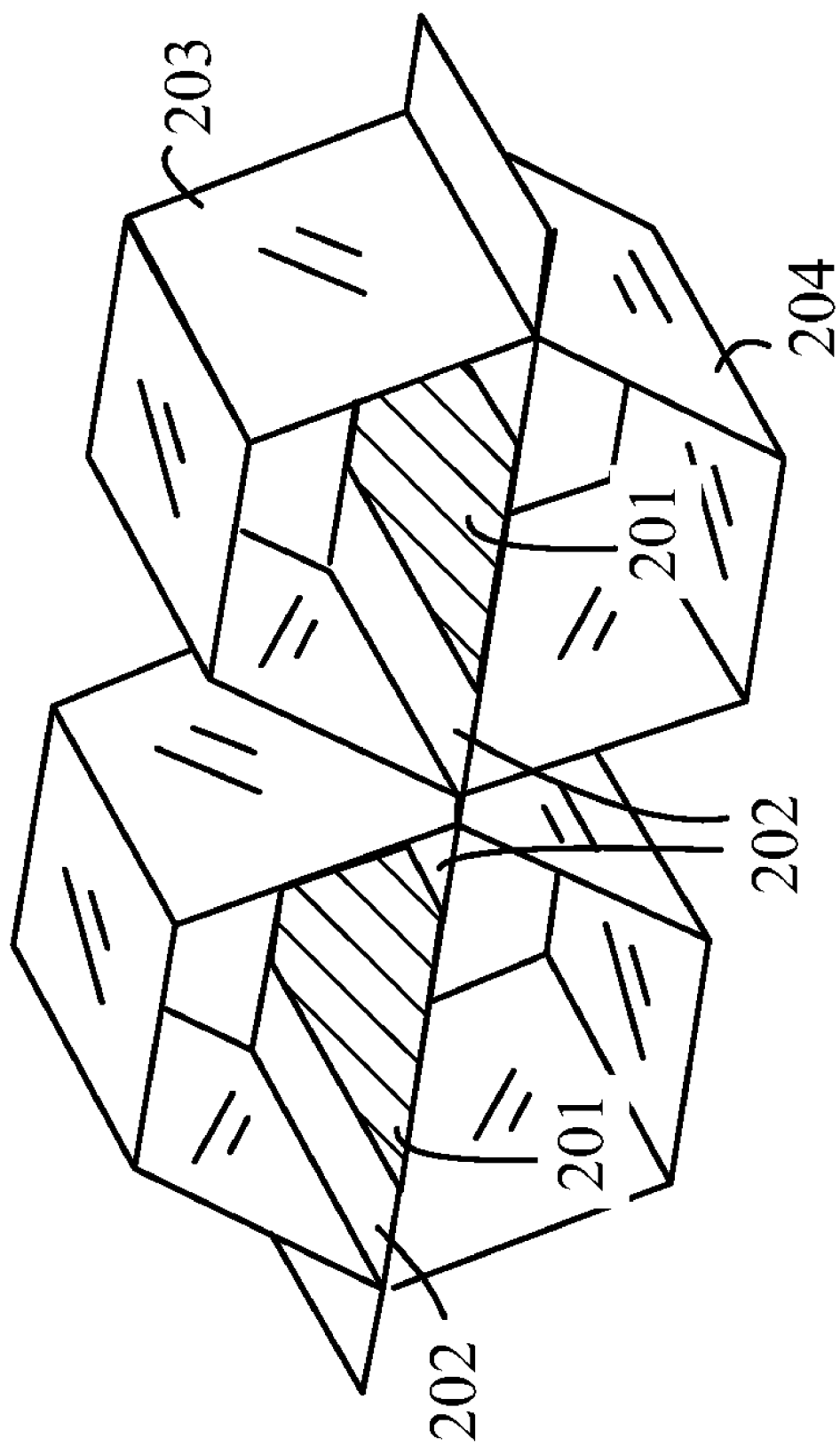
FIG. 15 illustrates a portion of a sheet of galvanic isolators according to another embodiment of the present invention.

It should be noted that the low cost of the substrates used in the present invention makes the incorporation of such shielding economically attractive. Refer now to FIG. 15, which illustrates a portion of a sheet of galvanic isolators according to one embodiment of the present invention. A number of galvanic isolators according to the present invention can be fabricated on a single sheet of a substrate having the required number of metal layers. Exemplary galvanic isolators are shown at 201. Spaces 202 can be provided between the individual galvanic isolators to provide the attachment point for the top and bottom halves of the shields. Since the substrate material is inexpensive, these spaces to not substantially increase the cost of the resulting galvanic isolators. The shields can be formed of two sheets 203 and 204 of the appropriate material by stamping the sheets to provide the desired dome shape. The stamped sheets can then be attached to the substrate sheet. The completed sheet of galvanic isolators can then be singulated by cutting the shielded sheet of galvanic isolators. Hence, a large number of galvanic isolators can be fabricated at once.

In the above-described embodiments of the present invention, the traces on the top and bottom surfaces of the galvanic isolator are exposed. It is sometimes useful to provide a covering for the exposed traces to protect the traces from damage. One method for providing a protective cover layer is to utilize the polyamide layers used in flexible circuit carriers such as those described above. Layers of polyamide that are covered with an adhesive are available commercially from Dupont. One such layer consists of a 0.5 mil layer of polyamide that is coated on one side with an adhesive that is 0.5 mil thick. The protective layer can be cut to provide holes in the layer that provide access to pads that require electrical connection or that are used for bonding chips such as the transmitter and receiver chips discussed above. After the layer is patterned, the protective backing is removed from the adhesive surface and the layer is pressed onto the corresponding surfaces of the galvanic isolator. The various wirebond connections and chip bonding is then carried out.

Figure 16:
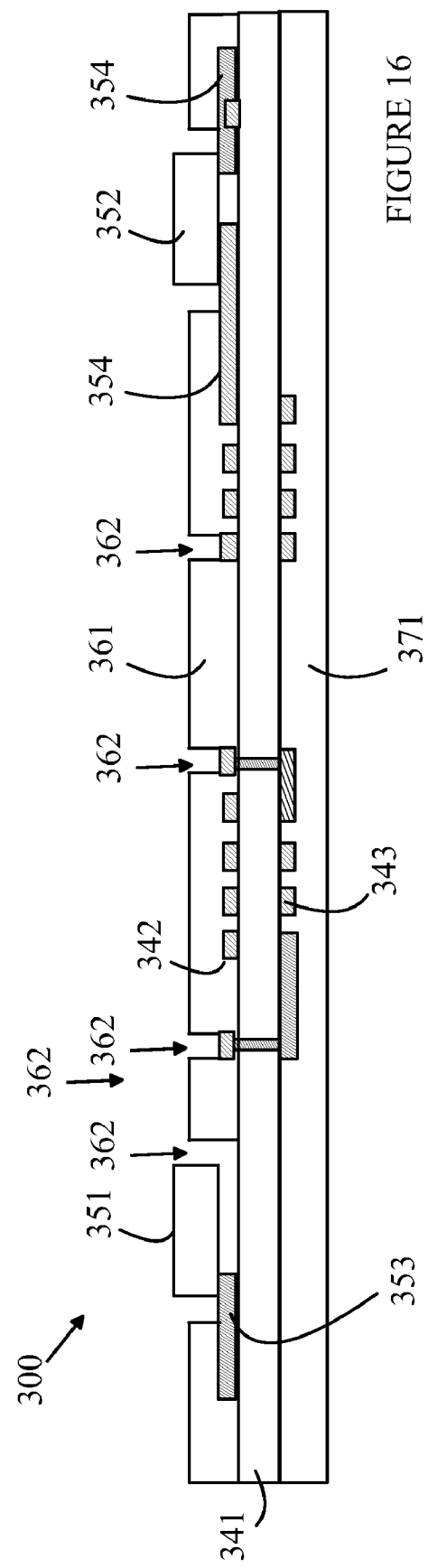
FIG. 16 is a cross-sectional view of a galvanic isolator according to another embodiment of the present invention.

Refer now to FIG. 16, which is a cross-sectional view of another embodiment of a galvanic isolator according to the present invention. Galvanic isolator 300 is similar to galvanic isolator 40 discussed above in that it includes a top coil 342 and a bottom coil 343 that are constructed by patterning metal layers on the top and bottom surfaces of a polymer or polymer/inorganic substrate 341. The transmitter and receiver chips 351 and 352 are bonded to traces shown at 353 and 354, respectively. The top coil is protected by a polymer layer 361 that includes an adhesive layer that is in contact with the metal layer and exposed underlying surface of substrate 341. Holes shown at 362 are opened in layer 361 to provide access to the bond pads used for the wire bonds and the transmitter and receiver chips. Similarly, an adhesive coated polymer layer 371 is applied to the bottom surface of substrate 341 to protect the bottom coil. To simplify the drawing, the individual layers of the protective polymer layers 361 and 371 have been omitted.

Figure 17:
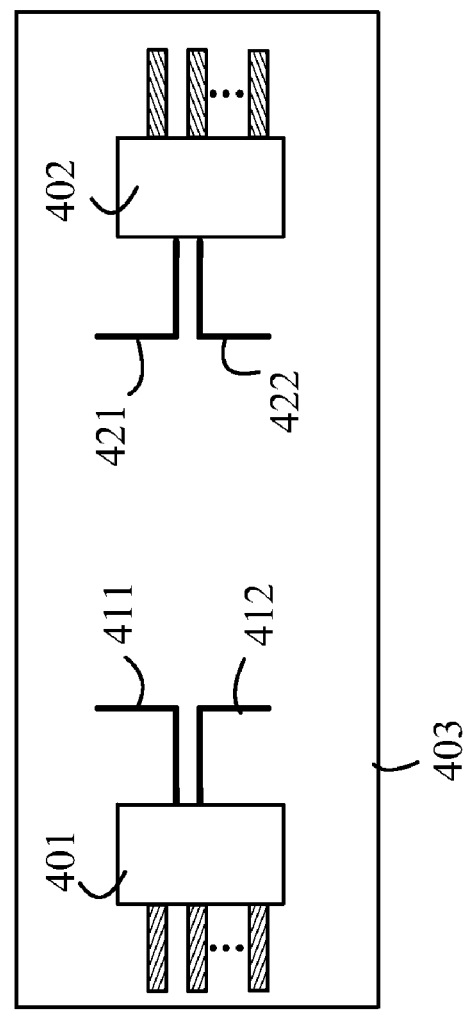
FIG. 17 is a top view of a galvanic isolator according to another embodiment of the present invention.

As noted above, the split circuit element can be constructed from a transmitting antenna and a receiving antenna. In the embodiments described above, the first and second portions of the split circuit element are disposed on different surfaces of the polymeric substrate. However, in the case of an antenna pair, the first and second portions can be disposed on the same surface separated by a distance that is sufficient to assure that the transmitting antenna does not arc to the receiving antenna. Refer now to FIG. 17, which illustrates another embodiment of a galvanic isolator according to the present invention. Galvanic isolator 400 utilizes a pair of antennae disposed on polymeric substrate 403. A transmitting chip 401 drives a transmitting antenna shown having branches shown at 411 and 412. A receiving chip 402 picks up the signals received on a receiving antenna having branches 421 and 422. It should be noted that branches 411, 412, 421, and 422 can be traces on substrate 403 or can be wires that extend outward from substrate 403. Such wire can be wire bonded to pads connected to traces on substrate 403.

Various modifications to the present invention will become apparent to those skilled in the art from the foregoing description and accompanying drawings. Accordingly, the present invention is to be limited solely by the scope of the following claims.

What is claimed is:

1. A galvanic isolator comprising:
a split circuit element having first and second portions;
a substrate comprising an insulating polymeric or polymeric/inorganic layer having first and second surfaces, said first portion and said second portion being disposed on said substrate;
a transmitter that receives an input signal and couples a signal derived from said input signal to said first portion; and
a receiver connected to said second portion that generates an output signal that is coupled to an external circuit;
wherein said first portion is disposed on said first surface and second portion being disposed on said second surface;
wherein said split circuit element comprises a capacitor having a first plate comprising said first portion and a second plate comprising said second portion, and wherein said substrate comprises a first planar region and a second planar region at an angle greater than 0 with respect to said first planar region, said split circuit being disposed across said second planar region.

2. A galvanic isolator comprising:
a split circuit element having first and second portions;
a substrate comprising an insulating polymeric or polymeric/inorganic layer having first and second surfaces, said first portion and said second portion being disposed on said substrate, wherein said polymeric layer comprises a first sub-layer having said first surface, an insulating sub-layer, and a second sub-layer having said second surface, said first and second sub-layers sandwiching said insulating sub-layer and being bonded thereto;
a transmitter that receives an input signal and couples a signal derived from said input signal to said first portion; and
a receiver connected to said second portion that generates an output signal that is coupled to an external circuit;
wherein said first portion is disposed on said first surface and second portion being disposed on said second surface;
wherein said split circuit element comprises a capacitor having a first plate comprising said first portion and a second plate comprising said second portion.

3. The galvanic isolator of claim 2, wherein said substrate is flexible.

4. The galvanic isolator of claim 2 wherein said substrate comprises a material chosen from the group consisting of polyamide, epoxy, and fiber glass impregnated with epoxy.

5. The galvanic isolator of claim 2 further comprising a planar conducting sheet surrounding said split circuit element and spaced apart therefrom by a distance greater than 10 mils.

* * * * *